United States Patent [19]

Roth

[11] Patent Number: 5,162,265
[45] Date of Patent: Nov. 10, 1992

[54] METHOD OF MAKING AN ELECTRICAL INTERCONNECTION HAVING ANGULAR LEAD DESIGN

[75] Inventor: Norman J. Roth, Kokomo, Ind.

[73] Assignee: Delco Electronics Corporation, Kokomo, Ind.

[21] Appl. No.: 732,289

[22] Filed: Jul. 18, 1991

Related U.S. Application Data

[62] Division of Ser. No. 604,691, Oct. 29, 1990.

[51] Int. Cl.⁵ .................... H01L 21/58; H01L 21/60
[52] U.S. Cl. .................... 437/220; 437/206; 437/217
[58] Field of Search .............. 437/206, 217, 220; 357/70

[56] References Cited

U.S. PATENT DOCUMENTS

| | | | |
|---|---|---|---|
| 3,803,458 | 4/1974 | Morena, Jr. | 317/234 R |
| 3,902,148 | 8/1975 | Drees et al. | 357/70 |
| 3,947,867 | 3/1976 | Duffek et al. | 357/70 |
| 3,968,563 | 7/1976 | Hamlin | 437/206 |
| 4,003,073 | 1/1977 | Helda et al. | 357/70 |
| 4,413,404 | 11/1983 | Burns | 437/206 |
| 4,529,999 | 7/1985 | Bender at al. | 357/58 |
| 4,667,219 | 5/1987 | Lee et al. | 357/68 |
| 4,789,889 | 12/1988 | Morris et al. | 357/69 |

FOREIGN PATENT DOCUMENTS

| | | | |
|---|---|---|---|
| 57-89230 | 6/1982 | Japan | 437/220 |
| 58-207646 | 12/1983 | Japan . | |
| 59-50570 | 3/1984 | Japan . | |
| 60-80233 | 5/1985 | Japan . | |
| 61-95559 | 5/1986 | Japan . | |
| 61-148854 | 7/1986 | Japan . | |
| 1-23544 | 1/1989 | Japan | 357/70 |

*Primary Examiner*—Olik Chaudhuri
*Assistant Examiner*—David E. Graybill
*Attorney, Agent, or Firm*—Cary W. Brooks

[57] ABSTRACT

A method of making an electrical interconnection is provided for electrically and physically connecting a plurality of bonding sites on an integrated circuit chip to a plurality of external electrical connections. This electrical interconnection method uses a plurality of individual electrical leads which have been formed so as to have the same degree of non-perpendicularity with respect to the rectangular shape of the integrated circuit. All of the individual leads are angled so as to rotate in the same direction around the integrated circuit. This angled lead design provides enhanced strain relief and improved performance during use since the integrated circuit is free to rotate under an applied stress, while efficiently maximizing the number of available electrical leads for bonding to the integrated circuit chip. In addition, this electrical interconnection method is suitable for use with tape automated bonding methods.

4 Claims, 2 Drawing Sheets

METHOD OF MAKING AN ELECTRICAL INTERCONNECTION HAVING ANGULAR LEAD DESIGN

This is a division of application Ser. No. 07/604,691, filed on Oct. 29, 1990.

The present invention generally relates to electrical interconnections which are useful for electrically connecting a plurality of bonding sites on an integrated circuit chip to a corresponding plurality of external connections. More particularly, this invention relates to an electrical interconnection design wherein each individual lead within the interconnection is formed so as to have the same degree of non-perpendicularity with respect to the rectangular shape of the integrated circuit chip. Thereby all of the individual leads are angled in the same direction around the integrated circuit providing enhanced strain relief and improved performance during use while maximizing the number of individual leads available per integrated circuit chip.

BACKGROUND OF THE INVENTION

Many methods are known for forming the electrical interconnections between an integrated circuit and the supporting substrate. Tape automated bonding (TAB) methods are commonly used for forming these such electrical interconnections. A TAB tape is provided which comprises a plurality of individual long, slender, electrically conductive leads attached to, and extending out from, the electrically conductive TAB tape. Each individual lead on the TAB tape is bonded to the integrated circuit at a bonding pad. There are typically many of these bonds on a single integrated circuit. These bonds are formed by first depositing a gold bump, or other suitable material, on either the end of the TAB tape lead or on the integrated circuit at the bonding pad. The integrated circuit and TAB tape leads, which are generally copper, are then aligned and simultaneously thermocompression gang bonded.

However, with any of these methods for forming the electrical interconnections, strain relief must be provided in the interconnection lead between the integrated circuit and supporting substrate, so as to compensate for any thermal or physical stresses arising during use. For example, when using tape automated bonding methods for forming the electrical interconnections, strain relief is commonly provided by forming the individual TAB tape leads in a serpentine manner, as shown in FIG. 1. The use of the serpentine shape essentially provides additional length to the individual lead, thereby permitting expansion of the individual leads to compensate for any stresses arising during use.

However, a shortcoming associated with the use of these individual serpentine leads is that the associated stresses generated during use become unbalanced due to the various serpentine lead lengths and the positioning of each serpentine lead from different directions around the integrated circuit. This unbalanced state results in higher failure rates for the individual bonds on the integrated circuit and correspondingly for the device. In addition, the current serpentine design results in increased lead stress during mounting of the integrated circuit to a substrate or other surface, since the various lengths of each lead again result in an unbalanced stress load during mounting.

An alternative to the current serpentine design for electrical interconnections, which provides for improved and balanced stress relief during use and mounting of the integrated circuit, is disclosed in U.S. Ser. No. 07/448,453 to Eytcheson, filed Dec. 11, 1989, entitled "Interconnection Lead Having Individual Spiral Lead Design", and assigned to the same assignee of the present invention. In Eytcheson, an interconnection pattern is taught having individual leads which are arcuate shaped and disposed in a spiral pattern around the integrated circuit. This spiral interconnection pattern provides improved strain relief over the conventional serpentine design, since the individual, arcuate shaped electrical leads all expand in a spiral pattern, thereby causing the integrated circuit to rotate in a single direction when a stress is applied to the integrated circuit. The resulting stress loads are therefore more balanced than with previous lead designs.

However, although the spiral design provides enhanced strain relief, a shortcoming exists with regard to its use. The arcuate shapes of the individual electrical leads do not permit the most efficient utilization of the space on and around an integrated circuit chip. Therefore, the number of electrical interconnection leads per integrated circuit is limited. As the complexity of integrated circuits increases while their physical dimensions decrease, it is of prime importance to provide an interconnection lead which permits maximization of the number of leads per integrated circuit.

Therefore, what is needed is an electrical interconnection lead which provides for, not only balanced stress relief during use and mounting of the integrated circuit, but which also provides an efficient design for maximization of the number of individual leads available per integrated circuit.

SUMMARY OF THE INVENTION

It is an object of the present invention to provide an electrical interconnection having a plurality of individual leads for electrically and physically connecting a plurality of bond sites on an integrated circuit to a corresponding plurality of external connections.

It is a further object of this invention that such an electrical interconnection provide enhanced strain relief during use of the integrated circuit.

It is still a further object of this invention that such an electrical interconnection provide an efficient design for maximization of the number of individual leads per integrated circuit.

In accordance with a preferred embodiment of this invention, these and other objects and advantages are accomplished as follows.

An electrical interconnection is provided for electrically and physically connecting a plurality of bonding sites on an integrated circuit to a plurality of external electrical connections. The electrical interconnection contains a plurality of individual electrical leads and may be suitable for use with tape automated bonding methods.

An inventive feature of this invention is that each of the individual electrical leads is formed so as to be non-perpendicular with respect to the rectangular shape of the integrated circuit. Further, all of the individual leads have the same degree of non-perpendicularity. Thereby all of the individual leads are angled similarly around the integrated circuit.

This electrical interconnection design provides enhanced strain relief during use, since the individual angled leads permit rotation of the integrated circuit during mounting or excessive applied lead stress. Because the leads are all disposed so as to be angled in the same direction around the integrated circuit, the applied stress is balanced resulting in improved device performance and yields.

Further, with this electrical interconnection design, the individual leads are efficiently shaped, thereby maximizing the number of individual leads per integrated circuit.

Other objects and advantages of this invention will be better appreciated from the following detailed description thereof.

BRIEF DESCRIPTION OF THE DRAWINGS

The above and other advantages of this invention will become more apparent from the following description taken in conjunction with the accompanying drawings wherein like references refer to like parts and wherein.

DETAILED DESCRIPTION OF THE INVENTION

Figure 1:
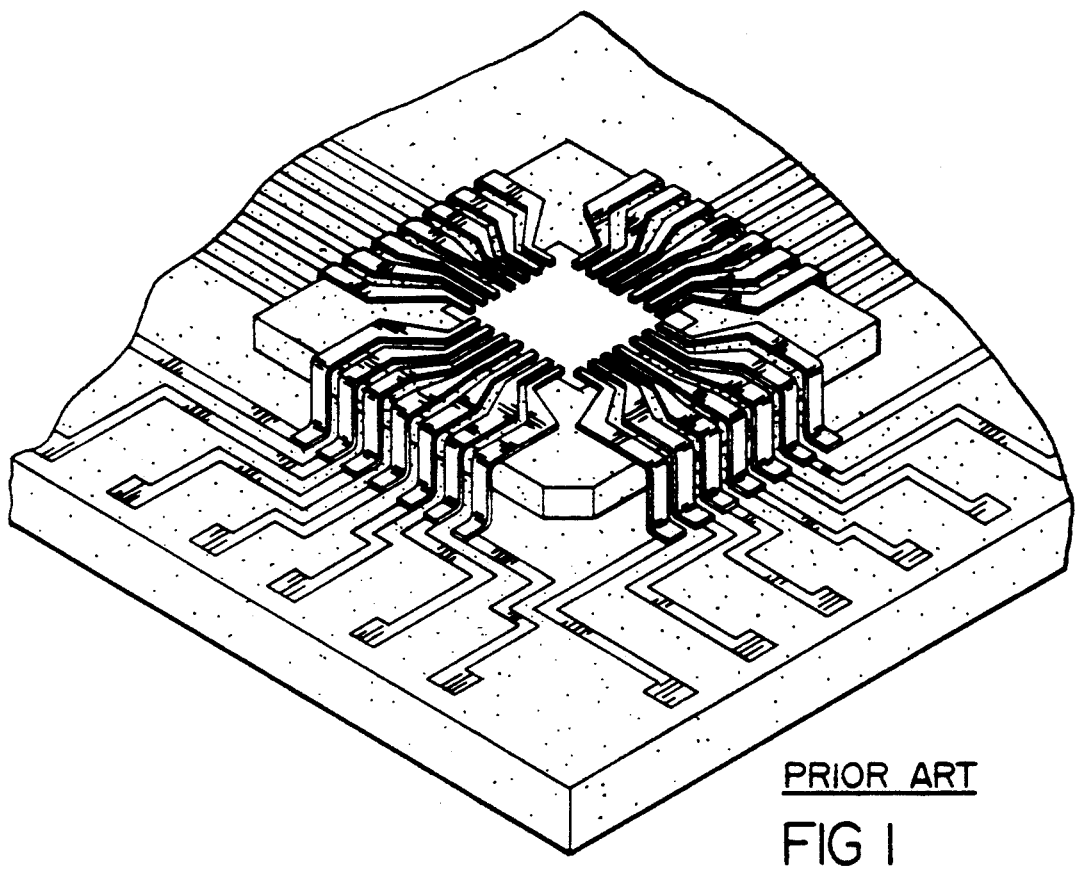
FIG. 1 illustrates a conventional interconnection design having individual serpentine leads which is generally used throughout the art.
Figure 2:
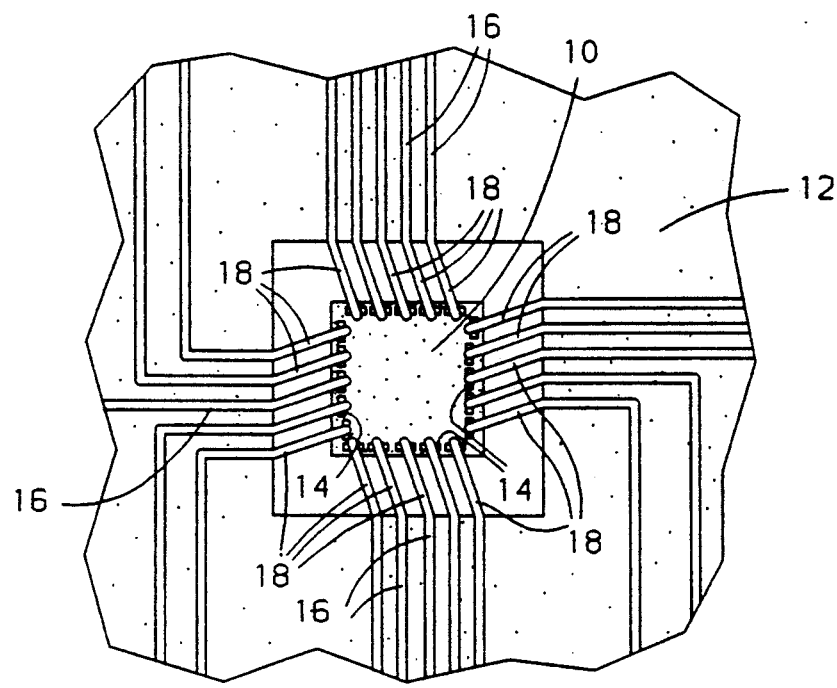
FIG. 2 illustrates an electrical interconnection in accordance with a preferred embodiment of this invention showing the angled individual leads.

As shown in FIG. 2, an electrical interconnection pattern is provided for electrically and physically connecting a plurality of bonding sites 14 on an integrated circuit chip 10 to a plurality of external electrical connections (not shown) on the supporting substrate 12 which may be any of the conventional types of substrates utilized in the art.

The electrical interconnection pattern consists of a plurality of individual electrical leads 16. The individual leads 16 are formed from an electrically conductive material, preferably copper although other suitable electrically conductive materials may also be used. The individual leads 16 are formed using conventional techniques.

Each of the individual electrical leads 16 is formed so as to be angled 18 at essentially the same degree, at that region adjacent to where each individual lead 16 is bonded to the integrated circuit 10. As shown, the individual leads 16 are angled 18 so as to be non-perpendicular with respect to the rectangular shape of the integrated circuit chip 10. The degree of non-perpendicularity is essentially identical for all of the leads 16, such that the leads 16 are all angled 18 to the same degree and to the same direction around the integrated circuit 10. In addition, the portion of each individual lead 16 between its angled region 18 and the bonding site 14 are of similar length Preferably, the degree to which the individual leads 16 are non-perpendicular with respect to the rectangular shape of the integrated circuit chip 10, is less than about 45 degrees. If this oblique angle were greater than about 45 degrees, the advantages of this invention including a balanced stress load among the bonded individual 16 and an efficient lead design for maximization of the lead 16 density per integrated circuit chip 10, are significantly diminished. It is even more preferred that the degree of non-perpendicularity be about 30 degrees, plus or minus about 5 degrees. In this preferred range, the above-stated advantages appear to be optimized.

Figure 3:
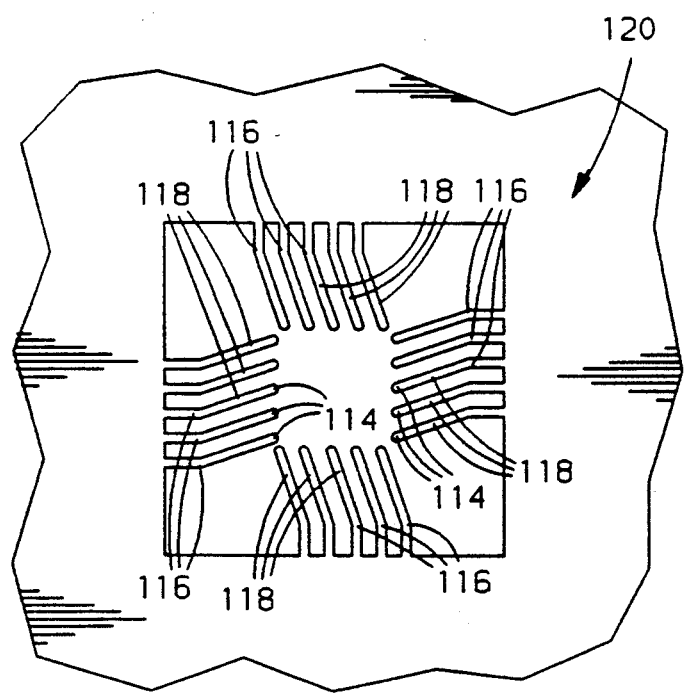
FIG. 3 illustrates an electrical interconnection in accordance with a preferred embodiment of this invention which is suitable for use with tape automated bonding methods.

Alternatively, this electrical interconnection pattern may be integral with an electrically conductive TAB tape 120, as shown in FIG. 3, and used with tape automated bonding methods. The electrically conductive tape 120, probably copper although other suitable electrically conductive materials may also be used, consists of a plurality of individual electrical leads 116. The individual electrical leads 116 are adjacent to and integral with the electrically conductive TAB tape 120.

Each of the electrical leads 116 is formed so as to be angled 118 at essentially the same degree, at that region adjacent to where each individual lead 116 will be bonded to an integrated circuit chip (not shown). As shown, the individual leads 116 are angled 118 so as to be non-perpendicular with respect to the rectangular shape of an integrated circuit chip. The leads 116 are all angled to the same degree and to the same direction. In addition, the portion of each lead 116 between the angled region 118 and its bonding end 114 are all of similar length.

As stated previously, the degree of non-perpendicularity is preferably no greater than about 45 degrees and even more preferably between about 25 to about 35 degrees. The benefits of this electrical interconnection invention appear to be optimized in this preferred range.

As shown in FIG. 3, the individual leads 116 are attached to, and extend out from, the electrically conductive TAB tape 120. Each of the individual leads 116 on the TAB tape 120 would be bonded to the integrated circuit at a bonding pad. These bonds are formed by first depositing a gold bump, or other suitable material, on either the bonding end 114 of the TAB tape lead 116 or alternatively on the integrated circuit at a corresponding bonding pad. The integrated circuit and TAB tape leads 116 would then be aligned and simultaneously thermocompression gang bonded. The integrated circuit would then be excised from the TAB tape 120 at a point beyond the angled region 118 of each lead 116 and subsequently mounted on an appropriate substrate, if this had not already been done, and outer leads appropriately formed by similar thermocompression gang bonding techniques between the individual leads 116 and the substrate.

With either embodiment, this electrical interconnection design provides improved strain relief during use of the integrated circuit. It is not uncommon for stresses to arise during use due to differences in thermal coefficients for the various materials, or vibration, or during mounting and handling of the components when there may be an excessively applied stress. The similarly angled leads permit the integrated circuit chip to rotate when stressed. With this electrical interconnection, the individual leads flex unidirectionally under the applied stress, instead of in various directions. This pattern results in a stress load which is more evenly balanced around the integrated circuit and within the bonds and individual leads, thereby improving the durability of the individual leads and correspondingly the durability of the entire integrated circuit device.

As a particular example, if the integrated circuit remains free floating after being bonded to the individual leads, such as with tape automated bonding methods, the integrated circuit is free to rotate under an applied stress. The integrated circuit freely rotates because all of the individual leads are angled in a single, circular direction around the integrated circuit chip. The integrated circuit's ability to rotate freely, balances the applied stress between all of the integrated circuit bonds, thereby advantageously reducing the stress to the individual leads and the integrated circuit.

Alternatively, if the integrated circuit chip is mounted to a substrate or other surface, such as a heat sink, this electrical interconnection compensates for any differences in vertical tolerances between the device components. This is accomplished since the angled leads provide a unidirectional twist during the vertical down setting of the integrated circuit chip. The integrated circuit rotates with equal deflection applied to each of the individual leads. This rotational motion results in balanced stresses to each integrated circuit bond also. Even after mounting, this angled lead design still retains adequate length and flexibility to provide significant strain relief under applied stress.

In addition, this electrical interconnection design is elegantly efficient in its simplistic design. These individual angled leads utilize about as much space on and around the integrated circuit chip as conventional straight leads, except that the angled leads also provide significantly better strain relief since they allow the chip to rotate under stress instead of being pulled in tension as with the conventional straight leads. Further, these angled leads utilize significantly less space on and around the chip than the serpentine-shaped or spiral-shaped leads, while providing at least the same amount of strain relief as these conventional leads.

With this interconnection pattern, the various individual leads may originate from anywhere on the substrate (see FIG. 2), and still be appropriately angled near the bonding region so as to be non-perpendicular with respect to the rectangular shape of the integrated circuit chip. The angled lead design maximizes the number of leads available per integrated circuit chip, since the design does not unnecessarily use extra space on and around the chip.

This electrical interconnection design provides enhanced strain relief during use of the integrated circuit while also maximizing the number of leads per chip. Although this invention has been described in terms of a preferred embodiment, alternative embodiments are also possible and considered within the scope of this invention, such as the application of these techniques to an alternative bonding method such as flexible circuitry or to an integrated circuit being mounted to a printed circuit board.

Accordingly, our invention is to be limited only by the following claims.

The embodiments of the invention in which an exclusive property or privilege is claimed are defined as follows:

1. A method of downsetting an integrated circuit chip/electrical interconnection combination so as to reduce the stress applied to the electrical interconnection during downsetting comprising the steps of:
   providing an integrated circuit chip;
   providing an electrical interconnection comprising a plurality of individual tape leads for electrically connecting a plurality of bonding sites onto a rectangular shaped integrated circuit chip to a plurality of external electrical connections wherein each of said individual leads is constructed and arranged in non-perpendicular position with respect to an associated side of the rectangular shaped integrated circuit and so that each of said individual leads have the same degree of non-perpendicularity, and so that all of said leads are angled clockwise, or all of the leads are angled counterclockwise, around the integrated circuit; wherein said lead comprises a first straight portion directly intersecting a second straight portion at an angle to form said angled lead; and
   downsetting said integrated circuit chip so that said angled leads provide an unidirectional twist and said integrated circuit rotates with equal deflection applied to each of the individual leads and so that said angled leads retain adequate length and flexibility to provide significant strain relief under applied stress.

2. A method of using a plurality of electrically conductive tape leads, each of said leads having a bonding end and essentially an identical oblique angle adjacent their bonding ends and essentially identical distances between and apex of their oblique angle and their bonding ends, and wherein said lead comprises a first straight portion directly intersecting a second straight portion at an angle to form said angled lead, comprising the steps of:
   bonding each of said leads adjacent said bonding end directly to an associated side of a rectangular shaped integrated circuit chip so that all of said leads are angled clockwise, or the leads are all angled counterclockwise, around said integrated circuit chip and so that the stress applied to said leads upon downsetting or operating of the integrated circuit is balanced between each lead around said chip.

3. A method as set forth in claim 2 wherein said oblique angle is no greater than 45°.

4. A method as set forth in claim 2 wherein said oblique angle is about 24°-35°.

* * * * *